United States Patent [19]

Tamura et al.

[11] Patent Number: 4,740,698
[45] Date of Patent: Apr. 26, 1988

[54] HYBRID CHARGED PARTICLE APPARATUS

[75] Inventors: Hifumi Tamura, Hachioji; Norio Saitou, Iruma; Kaoru Umemura, Kokubunji, all of Japan

[73] Assignee: Hitachi, Ltd., Tokyo, Japan

[21] Appl. No.: 30,474

[22] Filed: Mar. 26, 1987

[30] Foreign Application Priority Data

Mar. 26, 1986 [JP] Japan .................................. 61-65644

[51] Int. Cl.$^4$ .............................................. H01J 37/26
[52] U.S. Cl. .................................... 250/310; 250/309
[58] Field of Search .......................... 250/310, 309, 306

[56] References Cited

U.S. PATENT DOCUMENTS 4,562,352 12/1985 Shiokawa ............................. 250/310
4,694,170 9/1987 Slodzian et al. ..................... 250/310

OTHER PUBLICATIONS

Semiconductor World, 5 (1984) pp. 54–58.

Primary Examiner—Carolyn E. Fields
Assistant Examiner—John A. Miller
Attorney, Agent, or Firm—Antonelli, Terry & Wands

[57] ABSTRACT

A hybrid charged particle apparatus includes a charged particle source which is made up of a field-emission electron source for emitting an electron beam, a liquid-metal ion source for emitting an ion beam, and change-over means for replacing one of the electron and ion sources by the other at a predetermined place without varying a vacuum state, hybrid focusing/deflecting means for focusing and deflecting each of the electron beam and the ion beam electrostatically and electromagnetically to irradiate a specimen with each of the electron beam and the ion beam, and image observing means for detecting secondary charged particles emitted from the specimen and for observing an image of a specimen surface formed by the secondary charged particles.

6 Claims, 2 Drawing Sheets

HYBRID CHARGED PARTICLE APPARATUS

BACKGROUND OF THE INVENTION

The present invention relates to a hybrid charged particle apparatus, and more particularly to a hybrid charged particle apparatus which is suited for estimating the three-dimensional characterization at local areas of various materials such as a semiconductor material, that is, can form and estimate ultra-micro devices such as a large scale integration circuit.

A conventional charged particle apparatus, as described on pages 54 to 58 of a Japanese literature "Semiconductor World", Vol. 5, 1984, is made up of a single charged particle source, one kind of electrostatic lens, and a single deflector using an electric or magnetic field. That is, the conventional apparatus does not include means for replacing one of an ion source and an electron source by the other source at a predetermined place without varying a vacuum state, a hybrid lens formed of electrostatic and electromagnetic lenses, and a hybrid deflector formed of electrostatic and electromagnetic deflectors. Thus, the conventional apparatus does not have functions of forming both an electron beam and an ion beam in the same optical system, focusing the electron beam and the ion beam independently of each other or in the same operating mode, and deflecting the electron beam and the ion beam independently of each other or in the same operating mode.

In a case where the characterization at a local area is estimated by the conventional charged particle apparatus, there arise the following problems.

(1) The conventional charged particle apparatus does not have a function of observing and estimating the internal structure of the local area three-dimensionally.

(2) A focused ion beam can etch the local area by sputtering, and hence can expose that inner part of the local area which is to be estimated. However, an ion beam is inferior in focusing to an electron beam, and it is impossible from the practical point of view to focus the ion beam on a spot having a diameter less than 1,000 Å. Meanwhile, the electron beam is excellent in focusing, and is advantageously used for observing a surface. However, the electron beam does not have the element transportation ability, and hence cannot expose an inner part of the local area. Accordingly, the internal structure of the local area cannot be estimated only by one of the ion beam and the electron beam.

SUMMARY OF THE INVENTION

It is object of the present invention to provide a hybrid charged particle apparatus which can generate both an ion beam and an electron beam, and can replace one of the electron beam and the ion beam by the other beam at a predetermined place, while maintaining a vacuum state.

When both an ion beam and an electron beam are formed within an apparatus, the characterization at a local area can be estimated in the following manner. A desired local area is etched by the ion beam on the basis of the element transportation ability thereof, that is, the sputtering phenomenon, and then the electron beam capable of detecting a fine area having a diameter of several angstroms is used for forming an image of the etched surface having a high resolution. Thus, the characterization at the desired local area can be readily estimated. In this case, the surface having been etched by the ion beam is fairly activated, and is coated with an absorbed layer or degenerated layer when exposed to air. Accordingly, it is required to carry out the etching and the image formation continuously in the same vacuum state.

In order to attain the above object, according to the present invention, there is provided a hybrid charged particle apparatus which comprises: a charged particle source including an electron source for emitting an electron beam, an ion source for emitting an ion beam and changeover means for replacing one of the electron source and the ion source by the other source at a predetermined place without varying a vacuum state, hybrid focusing/deflecting means for focusing and deflecting each of the electron beam and the ion beam electrostatically and electromagnetically to irradiate a specimen with each of the electron beam and the ion beam; and image observing means for detecting secondary charged particles emitted from the specimen and for observing an image of a specimen surface formed by the secondary charged particles. Preferably, a field-emission electron source and a liquid-metal ion source are used as the above electron and ion sources, respectively.

The hybrid charged particle apparatus according to the present invention will be explained below in more detail. A charged particle extracting electrode common to the field-emission electron source and the liquidmetal ion source is disposed on the optical axis of a charged particle optical system. The emitter portions of the electron and ion sources are mounted on the tips of vertically movable mechanisms each having a spring mechanism, to make the vertical movement of the emitter portions possible, and the vertically movable mechanisms are mounted on a horizontally movable plate to place one of the emitter portions on the optical axis. Further, a vertical drive mechanism is air-tightly mounted on a vacuum vessel to move one of the emitter portions vertically on the optical axis so that the emitter portion is correctly located in relation to the charged particle extracting electrode.

A hybrid lens system made up of electrostatic and electromagnetic lenses is provided in the charged particle apparatus to focus the electron beam and the ion beam independently of each other, or in the same operating mode if necessary. In this lens system, the N- and S-poles of the electromagnetic lens are also used as the outer electrodes of the electrostatic lens, and a nonmagnetic electrode insulated from the outer electrodes is disposed between the outer electrodes, to be used as the intermediate electrode of the electrostatic lens.

Further, a hybrid deflecting/scanning system made up of electrostatic and electromagnetic deflectors is provided in the charged particle apparatus to deflect (or scan) the electron beam and the ion beam independently of each other, or in the same operating mode if necessary. In this deflecting/scanning system, magnetic poles for electromagnetic deflection are also used as deflecting electrodes for electrostatic deflection. In more detail, the deflecting electrodes are electrically insulated from each other, and a coil for generating a magnetic field is wound around the electrodes through an insulating layer so that a voltage for electrostatic deflection can be applied between the deflecting electrodes without producing an adverse effect upon the coil.

DESCRIPTION OF THE PREFERRED EMBODIMENT

Now, explanation will be made of an embodiment of a hybrid charged particle apparatus according to the present invention, with reference to the accompanying drawings.

Figure 1:
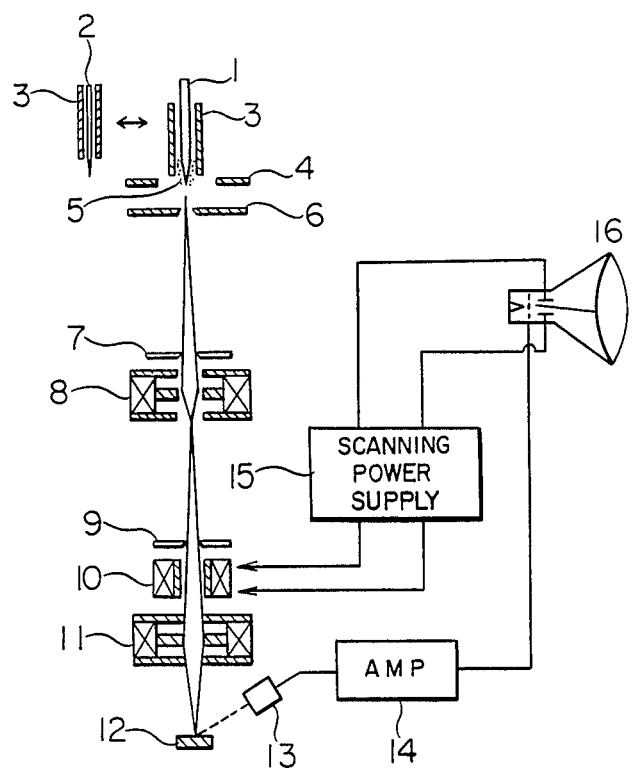
FIG. 1 is a schematic diagram showing the construction of an embodiment of a hybrid charged particle apparatus according to the present invention.

FIG. 1 shows the construction of the embodiment schematically. Referring to FIG. 1, a hybrid charged particle beam source is made up of the tip 1 of a liquid-metal ion source, the emitter tip 2 of a field-emission electron source, cylindrical tubes 3 serving as a guide tube and an ion reservoir, a shielding electrode 4, an ion source material 5, a charged particle extracting electrode 6, and heating means (not shown) for heating electron and ion emitters. The position of the emitter tip 1 of the ion source and the position of the emitter tip 2 of the electron source can be varied under vacuum, as will be explained later. When the emitter tip 1 of the ion source is disposed as shown in FIG. 1, an ion beam is emitted. When the emitter tip 2 of the electron source is placed at the depicted position of the emitter tip 1, an electron beam is emitted. The ion and electron beams thus obtained are focused and deflected by a charged particle beam focusing/deflecting system which is made up of a diaphragm 7 for condenser lens, a hybrid condenser lens 8, a diaphragm 9 for objective lens, a hybrid deflector 10, and a hybrid objective lens 11, to impinge upon a specimen 12. An image of the surface of the specimen 12 is formed and observed by an image observing system which is made up of a secondary charged particle detector 13 for detecting secondary charged particles emitted from the specimen 12, an amplifier 14, a power supply 15 for deflecting and scanning the electron and ion beams, and a cathode ray tube 16 for displaying an image which is formed by the secondary charged particles. In each of the hybrid condenser lens 8 and the hybrid objective lens 11, the pole pieces of an electromagnetic lens are also used as the outer electrodes of an electrostatic lens, and a lens voltage necessary for the electrostatic lens and a coil current necessary for the electromagnetic lens are applied to each hybrid lens independently of each other to operate each hybrid lens as one of the electrostatic lens and the electromagnetic lens selectively. Further, in the hybrid deflector 10, the deflecting plates of an electrostatic deflector are also used as the deflecting plates of an electromagnetic deflector, and a deflecting voltage necessary for the electrostatic deflector and a coil current necessary for the electromagnetic deflector are applied to the hybrid deflector independently of each other to operate the hybrid deflector as one of the electrostatic deflector and the electromagnetic deflector.

Figure 2:
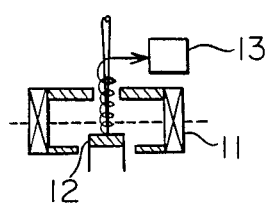
FIG. 2 is a schematic diagram showing an example of the hybrid objective lens of FIG. 1, which example is operated so as to have a short focal length.

FIG. 2 shows a positional relation among the hybrid objective lens 11, the specimen 12 and the secondary charged particle detector 13, at a time when the present embodiment is operated as an ultra-high resolution scanning electron microscope. Unlike the arrangement of the members 11 and 12 shown in FIG. 1, the specimen 12 is inserted into the objective lens 11. That is, an in-lens system is used to operate the scanning electron microscope in a state that the objective lens has a short focal length, and to form an image having a high resolution.

Figure 3:
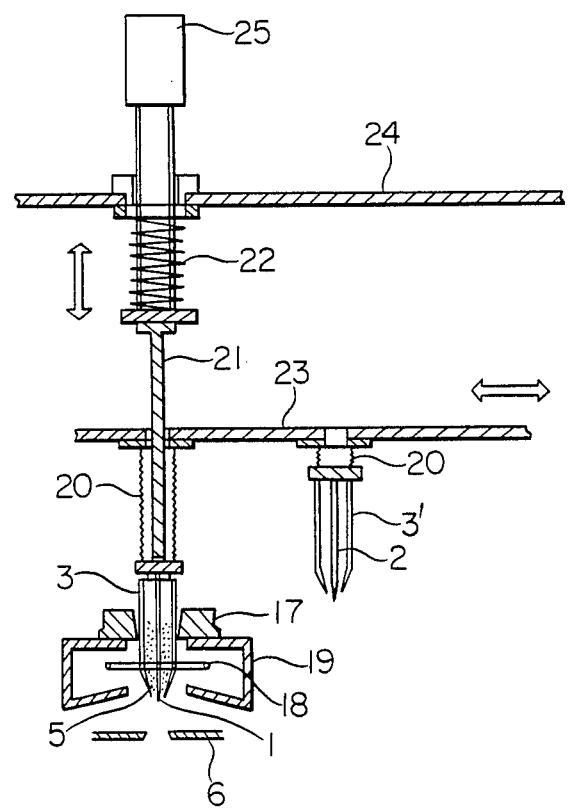
FIG. 3 is a schematic diagram showing a change-over mechanism which is used for replacing one of the field-emission electron source and the liquid-metal ion source shown in FIG. 1 by the other source at a predetermined place without varying a vacuum state.

FIG. 3 shows the changeover mechanism of an charged particle source which is used in the present embodiment. The changeover mechanism is air-tightly mounted on a vacuum vessel. Referring to FIG. 3, the chaged particle source includes the charged particle emitters 1, 2, 3, 3' and 5, the charged particle extracting electrode 6, a guide 17 for guiding the ion emitter 1, 3 and 5 and the electron emitter 2 and 3', electron beam heating means formed of a heating filament 18 and a control electrode 19, spring mechanisms 20 for moving the ion emitter and electron emitter vertically, a pressing rod 21 lying on an optical axis and provided with an air-tight bellows 22 for moving one of the spring mechanisms 20 vertically, a driving device 25 provided on the outside of a vacuum vessel 24 for driving the pressing rod 20 vertically, and a horizontally movable plate 23 coupled air-tightly to the vacuum vessel 24 and mounted with the ion and electron emitters, for moving the ion and electron emitters in a horizontal direction (namely, in a direction perpendicular to the optical axis) so that a desired one of the ion and electron emitters is placed on the optical axis. Driving mechanisms for driving the pressing rod 21 and the plate 23 are mounted airtightly on the vacuum vessel 24. The ion emitter can be used as the electron emitter, and vice versa. In a case where the ion emitter including the members 1, 3 and 5 is used as an electron emitter, the material and shape of the emitter tip 1 may be varied. Further, the cylindrical reservoir 3 having a conical apex, in which the emitter tip 1 is inserted, can also be used for the above electron emitter, and the material of the reseroir 3 may be varied, if necessary. In a case where the electron emitter including the members 2 and 3' is operated as a field-emission electron source, the electron source basically does not require the guide tube 3', but it is advantageous to use the guide tube 3' having the same shape as the reservoir 3, for the purpose of controlling the electric field intensity at the apex of the emitter tip 2.

Now, a process for replacing the emitter tip 1 on the optical axis by the emitter tip 2 will be explained below. The driving device 25 is operated so as to move the pressing rod 21 upwardly. The emitter tip 1 is moved upwardly by the spring mechanism 20, in accordance with the movement of the pressing rod 21. The contraction of the spring mechanism 20 is stopped when the emitter tip 1 has been drawn out from the guide 17. The rod 21 is further moved upwardly till the rod 21 is drawn out from a through hole of the plate 23. In this state, the plate 23 is moved to the left so that the rod 21 is placed just over that through hole of the plate 23 which is provided over the emitter tip 2. Next, the driving device 25 is operated so as to move the rod 21 downwardly. Thus, the rod 21 is inserted into the above through hole, and then moves the emitter tip 2 downwardly. The rod 21 is moved downwardly so that the mitter tip 2 and the guide tube 3' pass through the guide 17 and then the emitter tip 2 is placed at a predetermined position. When a predetermined voltage is applied between the charged particle extracting electrode 6 and the emitter tip 2, the charged particle source of FIG. 3 operates as the field-emission electron source for emitting an electron beam. Further, the emitter tip 1 can be again disposed at the predetermined position in place of the emitter tip 2, by the same process as mentioned above.

Next, explanation will be made of a case where a local area of the specimen 12 is three-dimensionally observed by the present embodiment. At first, the charged particle source is operated as the field-emission electron source and the present embodiment is operated in a scanning electron microscopic mode, to accurately determine the position of a local area to be observed. Next, the charged particle source is operated as the liquid-metal ion source, to remove a surface layer of the local area by the sputtering based upon an ion beam. Then, the charged particle source is again operated as the field-emission electron source, to observe the exposed surface of the local area precisely by the scanning electron microscope. The combination of the ion etching and the observation by the scanning electron microscope is repeated, to etch the local area repeatedly in the direction of depth and to observe the local area three-dimensionally.

An example of the above three-dimensional observation will be explained below in detail.

The construction and operation of the charged particle source will first be explained. Gallium is used as the ion material, and the reservoir 3 is filled with gallium. Further, the emitter chip 1 of the liquid-metal ion source and the emitter tip 2 of the field-emission electron source are both made of tungsten.

The apex of each emitter tip is processed by electrochemical etching so that the diameter of the tip is less than 100 Å. The charged particle extracting electrode 16, the guide 17, the filament 18 and the control electrode 19 are fixedly disposed on the optical axis of the focusing lens system. The guide 17 is made of boron nitride (BN), which is an electrically and thermally insulating material. The electron emitter mounted on the plate 23 is first moved to the optical axis, and then moved downwardly by the rod 21 which is coupled to the driving device 25, so that the emitter tip 2 is placed at the predetermined position. In this state, an extraction voltage is applied between the charged particle extracting electrode 6 and the emitter tip 2, to obtain an electron beam due to field emission. The electron beam thus obtained is focused on the specimen 12 by the hybrid focusing lens system of FIG. 1. In more detail, the hybrid focusing lens system is operated as the electromagnetic lens system which is small in aberration, to focus the electron beam on the specimen. Further, the hybrid deflector is operated as the electromagnetic deflector to deflect the electron beam, though the electron beam can also be deflected by the electrostatic deflector. An aluminum plate containing the segregation of silicon is used as the specimen 12, and the surface of the specimen is scanned with the electron beam to form an image of this surface by secondary charged particles. The iamge is displayed on the cathode ray tube 16, to confirm the segregation of silicon in aluminum. Next, the rod 21 is moved upwardly to draw out the electron emitter from the guide 17, and the liquid-metal ion emitter which is made up of the emitter tip 1 and the reservoir 3 and is filled with gallium, is moved to the optical axis. Then, the ion emitter is inserted into the guide 17 in the same manner as explained with respect to the electron emitter so that the emitter tip 1 is placed at an optimum position. Thereafter, the emitter tip 1 and the reservoir 3 are heated by electron bombardment which is based upon electrons from the filament 18, to operate the charged particle source as the liquid-metal ion source. An ion beam emitted from the liquid-metal ion source is used to etch a desired local area of the specimen. Thereafter, the present embodiment is again operated in the scanning electron microscopic mode, to observe a high-resolution image of the etched surface. Further, the combination of the ion etching and the observation by the scanning electron microscope is repeated.

The three-dimensional structure of silicon segregation in aluminum was observed by the above method. Further, the method was applied to the detection of pattern defects in an integrated circuit, and succeeded in detecting point defects and identifying foreign substances.

Further, in a case where the above method was applied to the fabrication of micro devices, the etching action of the ion beam and the observation of the etched area by the scanning electron microscope were repeated, and thus fabrication was carried out which was very excellent in controllability and high in accuracy.

The present embodiment has the following advantages.

(1) One of the field-emission electron source and the liquid-metal ion source can be readily replaced by the other at a predetermined place, under vacuum. As a result, the electron source and the ion source can use the same optical system in common, and thus the costs of parts making up the present embodiment can be reduced.

(2) One of the field-emission electron source and the liquid-metal ion source can be readily replaced by the other at a predetermined place under vacuum, and moreover electron and ion beams emitted from these sources can be focused and deflected by the hybrid charged particle optical system. Accordingly, not only the ultra-fine fabricating of a micro device but also the three-dimensional observation of fabricated area or ultra-micro substance can be readily carried out.

(3) The hybrid lens system, which is used in fabricating the specimen by the ion beam and observing the fabricated area by the scanning electron microscope, makes the working distance shortened. Accordingly, the workability in fine fabrication is improved, and a high-resolution image of the fabricated area is formed.

(4) An in-lens system can be used for carrying out the fine fabrication by the ion beam and for observing the fabricated area by the scanning electron microscope. Accordingly, an ultra-high resolution image of the fabricated area can be formed.

The present embodiment is provided with the field-emission electron source and the liquid-metal ion source. It is needless to say that other electron sources and other ion sources may be used in place of the field-emission electron source and the liquid-metal ion source, respectively.

In the present embodiment, the electron source and the ion source use the charged particle extracting electrode in common. Alternately, the electron source and the ion source may include an electron extracting electrode and an ion extracting electrode, respectively, and the whole electron source including the electron extracting electrode may be moved horizontally together with the whole ion source including the ion extracting electrode.

As has been explained in the foregoing, according to the present invention, one of an electron beam and an ion beam can be replaced by the other at a predetermined place, under vacuum. Thus, the fine fabrication of a large scale integration circuit or others can be carried out by the ion beam, and moreover a fabricated area and an ultra-micro substance can be observed by the scanning electron microscope.

We claim:

1. A hybrid charged particle apparatus comprising:
    a charged particle source including an electron source for emitting an electron beam, an ion source for emitting an ion beam, and changeover means for replacing one of said electron source and said ion source by the other at a predetermined place without varying a vacuum state;
    hybrid focusing/deflecting means for focusing and deflecting each of said electron beam and said ion beam electrostatically and electromagnetically to irradiate a specimen with each of said electron beam and said ion beam; and
    image observing means for detecting secondary charged particles emitted from said specimen and for observing an image of a surface of said specimen, said image being formed by said secondary charged particles.

2. A hybrid charged particle apparatus according to claim 1, wherein said electron source is a field-emission electron source, and said ion source is a liquid-metal ion source.

3. A hybrid charged particle apparatus according to claim 2, wherein said field-emission electron source and said liquid-metal ion source use a charged particle extracting electrode in common.

4. A hybrid charged particle apparatus according to claim 3, wherein said changeover means includes a guide fixed on the optical axis of said hybrid focusing-/deflecting means for guiding one of the emitter portions of said field-emission electron source and said liquid-metal ion source to a predetermined position, a movable plate mounted with said emitter portions for placing one of said emitter portions on the axis of said guide, said charged particle extracting electrode disposed on said optical axis and spaced apart from said guide by a predetermined distance, and a vertical drive mechanism for placing one of said emitter portions at said predetermined position, which lies on the axis of said charged particle extracting electrode.

5. A hybrid charged particle apparatus according to claim 4, wherein each of said emitter portions is held by a spring mechanism which draws said emitter portion toward said movable plate.

6. A hybrid charged particle apparatus according to claim 4, wherein heating means for heating one of said emitter portions is fixedly provided, together with said guide and said charged particle extracting electrode.

* * * * *